(12) United States Patent
Zhang

(10) Patent No.: US 11,595,234 B2
(45) Date of Patent: Feb. 28, 2023

(54) EQUALIZER CIRCUIT, METHOD FOR SAMPLING DATA AND MEMORY

(71) Applicant: CHANGXIN MEMORY TECHNOLOGIES, INC., Hefei (CN)

(72) Inventor: Zhiqiang Zhang, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 0 days.

(21) Appl. No.: 17/400,491

(22) Filed: Aug. 12, 2021

(65) Prior Publication Data

US 2022/0094576 A1 Mar. 24, 2022

Related U.S. Application Data

(63) Continuation of application No. PCT/CN2021/097401, filed on May 31, 2021.

(30) Foreign Application Priority Data

Sep. 24, 2020 (CN) .......................... 202011018885.X (51) Int. Cl.
*H04L 25/03* (2006.01)
*H04L 7/033* (2006.01)

(52) U.S. Cl.
CPC ...... *H04L 25/03878* (2013.01); *H04L 7/0337* (2013.01); *H04L 25/03057* (2013.01)

(58) Field of Classification Search
CPC ......... H04L 25/03057; H04L 25/03878; H04L 7/0337
USPC .......................................................... 375/232
See application file for complete search history.

(56) References Cited

U.S. PATENT DOCUMENTS

| | | | |
|---|---|---|---|
| 5,120,985 | A | 6/1992 | Kimura |
| 8,457,190 | B2 | 6/2013 | Raghavan |
| 8,947,119 | B2 | 2/2015 | Jang |
| 9,317,052 | B1 | 4/2016 | Hwang |

(Continued)

FOREIGN PATENT DOCUMENTS

| | | |
|---|---|---|
| CN | 1889552 A | 1/2007 |
| CN | 101340408 A | 1/2009 |

(Continued)

OTHER PUBLICATIONS

International Search Report in the international application No. PCT/CN2021/097395, datedn Aug. 18, 2021, 2 pgs.

(Continued)

*Primary Examiner* — Leila Malek (74) *Attorney, Agent, or Firm* — Cooper Legal Group, LLC (57) ABSTRACT

An equalizer circuit, a method for sampling data and a memory are provided. The equalizer circuit includes a first input buffer circuit, a second input buffer circuit and a selecting and sampling circuit. The first input buffer circuit and the second input buffer circuit are respectively connected with the selecting and sampling circuit, and reference voltages used in the first input buffer circuit and the second input buffer circuit are different from each other. The selecting and sampling circuit selects to perform data sampling on a data signal outputted by the first input buffer circuit or the second input buffer circuit according to data outputted previously by the equalizer circuit, and takes sampled data as data outputted currently by the equalizer circuit.

15 Claims, 4 Drawing Sheets

(56) References Cited

U.S. PATENT DOCUMENTS

| | | |
|---|---|---|
| 9,806,915 B1 | 10/2017 | Elzeftawi et al. |
| 10,014,907 B2 | 7/2018 | Choi |
| 10,147,466 B1 | 12/2018 | Taylor |
| 10,347,319 B2 | 7/2019 | Mozak |
| 10,482,932 B2 | 11/2019 | Taylor |
| 10,938,607 B2 | 3/2021 | Shen |
| 2004/0203559 A1* | 10/2004 | Stojanovic ............ H04L 7/0276 455/403 |
| 2005/0111585 A1 | 5/2005 | Stojanovic |
| 2006/0233291 A1 | 10/2006 | Garlepp |
| 2009/0175326 A1 | 7/2009 | Stojanovic |
| 2009/0285272 A1 | 11/2009 | Stojanovic |
| 2010/0085087 A1* | 4/2010 | Dash ................ G01R 31/31721 327/143 |
| 2010/0142610 A1 | 6/2010 | Stojanovic |
| 2012/0213267 A1 | 8/2012 | Stojanovic |
| 2012/0224621 A1 | 9/2012 | Stojanovic |
| 2014/0002130 A1 | 1/2014 | Jang |
| 2015/0319016 A1 | 11/2015 | Stojanovic et al. |
| 2016/0209462 A1 | 7/2016 | Choi |
| 2016/0241249 A1* | 8/2016 | Balamurugan ......... H04L 25/03 |
| 2016/0308693 A1 | 10/2016 | Stojanovic et al. |
| 2017/0373521 A1 | 12/2017 | Kong et al. |
| 2018/0287829 A1 | 10/2018 | Stojanovic et al. |
| 2019/0096445 A1 | 3/2019 | Taylor et al. |
| 2019/0268187 A1 | 8/2019 | Stojanovic et al. |
| 2020/0259686 A1 | 8/2020 | Shen |
| 2021/0075651 A1 | 3/2021 | Stojanovic et al. |
| 2021/0218544 A1* | 7/2021 | Choy .................... H04L 7/0087 |

FOREIGN PATENT DOCUMENTS

| | | |
|---|---|---|
| CN | 105471787 A | 4/2016 |
| CN | 107657978 A | 2/2018 |
| CN | 105282063 B | 1/2020 |
| CN | 110719242 A | 1/2020 |
| CN | 110800055 A | 2/2020 |
| EP | 0381095 A2 | 8/1990 |
| WO | 2018005137 A1 | 1/2018 |
| WO | 2020005592 A1 | 1/2020 |

OTHER PUBLICATIONS

Supplementary European Search Report in the European application No. 21773432.6, dated Jun. 8, 2022, 9 pgs.

International Search Report in the international application No. PCT/CN2021/097401, dated Aug. 26, 2021, 3 pgs.

* cited by examiner

EQUALIZER CIRCUIT, METHOD FOR SAMPLING DATA AND MEMORY

The present application is a continuation application of International Patent Application No. PCT/CN2021/097401, filed on May 31, 2021, which claims priority to Chinese patent application No. 202011018885.X filed to China Patent Office on Sep. 24, 2020 and titled "EQUALIZER CIRCUIT, METHOD FOR SAMPLING DATA AND MEMORY". The contents of International Patent Application No. PCT/CN2021/097401 and Chinese patent application No. 202011018885.X are hereby incorporated by reference in their entireties.

TECHNICAL FIELD

The embodiments of the present disclosure relate to the technical field of integrated circuits, in particular to an equalizer circuit, a method for sampling data and a memory.

BACKGROUND

In high-speed links of computers, as a transmission speed of a data signal becomes faster, obvious Inter Symbol Interference (ISI) is generated inevitably. Therefore, equalizing data signals of the high-speed links is required, to obtain available data signals.

In design for a receiver circuit in the memory, continuous Time Linear Equalizer (CTLE) architecture is used for equalizing. A function of the CTLE architecture includes performing signal compensation according to attenuation characteristics of a channel, so as to improve the quality of the data signal.

However, it is difficult for the existing equalizing method to meet a requirement of a high-speed receiver for the receiving quality of a data signal. Therefore, how to further improve the receiving quality of the data signal is an urgent problem to be solved.

SUMMARY

The embodiments of the present disclosure provide an equalizer circuit, a method for sampling data and a memory, which can effectively improve the receiving quality of a data signal.

In a first aspect, the embodiments of the present disclosure provide an equalizer circuit, which includes a first input buffer circuit, a second input buffer circuit and a selecting and sampling circuit. The first input buffer circuit and the second input buffer circuit are respectively connected with the selecting and sampling circuit, and a reference voltage used in the first input buffer circuit is different from that used in the second input buffer circuit.

The selecting and sampling circuit selects to perform data sampling on a data signal outputted by the first input buffer circuit or a data signal outputted by the second input buffer circuit according to data outputted previously by the equalizer circuit, and takes sampled data as data outputted currently by the equalizer circuit.

In a second aspect, the embodiments of the present disclosure provide a method for sampling data; which is applied to an equalizer circuit. The equalizer circuit includes two input buffer circuits, and reference voltages used in the two input buffer circuits are different from each other.

The above method for sampling data includes operations as follows.

In response to a sampling block signal, data sampling is performed on a data signal outputted by one input buffer circuit selected from the two input buffer circuits according to data previously outputted by the equalizer circuit, and sampled data is taken as data outputted currently by the equalizer circuit.

In a third aspect, the embodiments of the present disclosure provide a memory. The memory includes an equalizer circuit, and the equalizer circuit includes a first input buffer circuit, a second input buffer circuit and a selecting and sampling circuit. The first input buffer circuit and the second input buffer circuit are respectively connected with the selecting and sampling circuit, and a reference voltage used in the first input buffer circuit is different from that used in the second input buffer circuit.

The selecting and sampling circuit selects to perform data sampling on a data signal outputted by the first input buffer circuit or a data signal outputted by the second input buffer circuit according to data outputted previously by the equalizer circuit, and takes sampled data as data outputted currently by the equalizer circuit..

In the equalizer circuit, the method for sampling data and the memory provided by the embodiments of the present disclosure, the equalizer circuit includes two input buffer circuits having different reference voltages. When the selecting and sampling circuit samples data, data acquisition is performed on the data signal outputted by one input buffer circuit selected from the two input buffer circuits according to the data outputted previously by the equalizer circuit.

BRIEF DESCRIPTION OF THE DRAWINGS

In order to more clearly describe the technical solutions in the embodiments of the present disclosure or the prior art, the drawings required in the description of the embodiments of the disclosure or the prior art are introduced simply. It is apparent that the drawings in the following description merely illustrate some embodiments of the present disclosure. Those skilled in the art, without contributing any creative labor, may obtain other drawings according to these drawings.

DETAILED DESCRIPTION

In order to make the purposes, technical solutions and advantages of the embodiments of the present disclosure clearer, the technical solutions in the embodiments of the present disclosure are described clearly and completely below with reference to the drawings in the embodiments of the present disclosure. It is apparent that the described embodiments are a part rather than all of the embodiments of the present disclosure. Based on the embodiments of the present disclosure, all other embodiments obtained by those skilled in the art without making any creative labor fall into the scope of protection of the present disclosure.

The embodiments of the present disclosure provide an equalizer circuit, which may be applied to various memories, and in particularly may be applied to receiver circuits in various types of memory products, for example, receiver circuits in DDR4 memories.

In addition, the equalizer circuit provided by the embodiment of the present disclosure may also be used when high-speed receivers are designed.

At present, CTLE architecture is used for equalization in the design of receiver circuits in the memory, and has a function of compensating signals according to the attenuation characteristics of channels, so as to improve the quality of the signal. However, it is difficult for the existing equalization method to meet the signal quality requirements of DDR4 memories.

In order to improve the signal quality, the equalizer circuit provided by the embodiments of the present disclosure includes two input buffer circuits having different reference voltages. When sampling data, the selecting and sampling circuit selects an input buffer circuit from the two input buffer circuits based on previously-sampled data, and performs data sampling on a data signal outputted by the selected input buffer circuit. Therefore, data equalization is performed in advance, thereby more effectively eliminating ISI and improving the receiving quality of the data signal.

Figure 1:
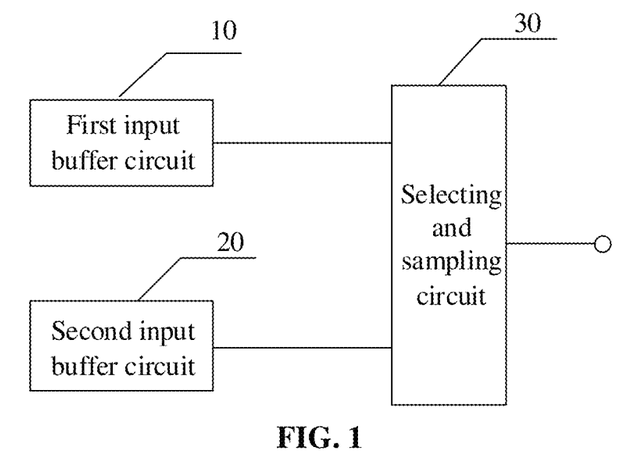
FIG. 1 illustrates a schematic diagram of a circuit structure of an equalizer circuit provided in the embodiment of the present disclosure.

Referring to FIG. 1, which illustrates a schematic diagram of a circuit structure of an equalizer circuit provided in an embodiment of the present disclosure, the equalizer circuit includes a first input buffer circuit 10, a second input buffer circuit 20 and a selecting and sampling circuit 30.

The first input buffer circuit 10 and the second input buffer circuit 20 are respectively connected with the selecting and sampling circuit 30. A reference voltage used in the first input buffer circuit 10 is different from that used in the second input buffer circuit 20.

The selecting and sampling circuit 30 selects to perform data sampling on a data signal outputted by the first input buffer circuit 10 or a data signal outputted by the second input buffer circuit 20 according to data outputted previously by the equalizer circuit, and takes sampled data as data outputted currently by the equalizer circuit.

Exemplarily, when a value of data outputted previously by the equalizer circuit is 1, the selecting and sampling circuit 30 selects to perform data sampling on the data signal outputted by the first input buffer circuit 10, and takes the sampled data as the data outputted currently by the equalizer circuit. When a value of data outputted previously by the equalizer circuit is 0, the selecting and sampling circuit 30 selects to perform data sampling on the data signal outputted by the second input buffer circuit 20, and takes the sampled data as the data outputted currently by the equalizer circuit.

It can be understood that since the reference voltage used in the first input buffer circuit 10 is different from that used in the second input buffer circuit 20, a voltage margin of the first input buffer circuit 10 is different from that of the second input buffer circuit 20 when the first input buffer circuit and the second input buffer circuit compare received data with the reference voltage. When sampling data, the selecting and sampling circuit 30 selects to perform data acquisition on the data signal outputted by the first input buffer circuit 10 or perform data acquisition on the data signal outputted by the second input buffer circuit 20 according to the data outputted previously by the equalizer circuit, such that the equalizer circuit can perform data equalization in advance according to the previously-outputted data, thereby facilitating eliminating ISI and improving the receiving quality of the data signal.

Figure 2:
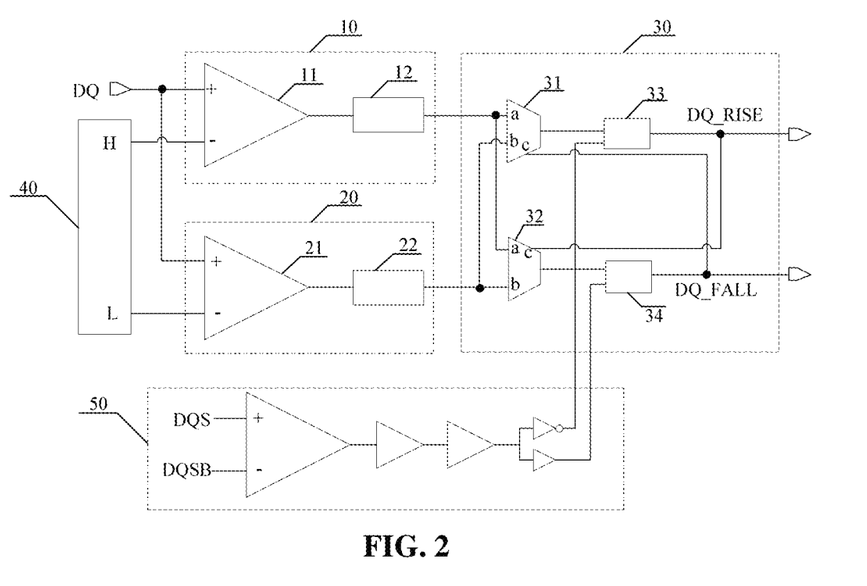
FIG. 2 illustrates a schematic diagram of another circuit structure of an equalizer circuit provided in the embodiment of the present disclosure.

Further, based on the content described in the above embodiment, referring to FIG. 2, FIG. 2 illustrates a schematic diagram of another circuit structure of an equalizer circuit provided in the embodiment of the present disclosure. In a feasible implementation of the present disclosure, the equalizer circuit further includes a reference voltage generator 40.

The reference voltage generator 40 includes a first reference voltage output terminal H and a second reference voltage output terminal L. A first reference voltage outputted by the first reference voltage output terminal H is different from a second reference voltage outputted by the second reference voltage output terminal L Alternatively, the first reference voltage is greater than the second reference voltage.

The first reference voltage output terminal H is connected with a reference voltage input terminal of the first input buffer circuit 10. The second reference voltage output terminal L is connected with a reference voltage input terminal of the second input buffer circuit 20.

In the embodiment of the present disclosure, the selecting and sampling circuit 30 includes a selecting circuit and a sampling circuit. The selecting circuit is connected with the sampling circuit. The selecting circuit may be configured to select to input the data signal outputted by the first input buffer circuit 10 or the data signal outputted by the second input buffer circuit 20 into the sampling circuit according to data transmitted by the sampling circuit. The sampling circuit is configured to perform data sampling on the data signal inputted by the selecting circuit.

Specifically, still referring to FIG. 2, the selecting circuit includes a first selecting circuit 31 and a second selecting circuit 32. The sampling circuit includes a first sampling circuit 33 and a second sampling circuit 34.

Two input terminals a and b of the first selecting circuit 31 are respectively connected with an output terminal of the first input buffer circuit 10 and an output terminal of the second input buffer circuit 20. Two input terminals a and b of the second selecting circuit 32 are respectively connected with the output terminal of the first input buffer circuit 10 and the output terminal of the second input buffer circuit 20.

An output terminal of the first selecting circuit 31 is connected with an input terminal of the first sampling circuit 33. A control terminal c of the first selecting circuit 31 is connected with an output terminal of the second sampling circuit 34. An output terminal of the second selecting circuit 32 is connected with an input terminal of the second sampling circuit 34. A control terminal c of the second selecting circuit 32 is connected with an output terminal of the first sampling circuit 33.

The first sampling circuit 33 is configured to transmit currently-sampled data DQ_RISE to the control terminal c of the second selecting circuit 32. The second selecting circuit 32 selects to input data in the first input buffer circuit 10 or the second input buffer circuit 20 into the second sampling circuit 34 based on the data DQ_RISE transmitted by the first sampling circuit 33.

The second sampling circuit 34 is configured to transmit currently-sampled data DQ_FALL to the control terminal c of the first selecting circuit 31. The first selecting circuit 31 selects to input the data in the first input buffer circuit 10 or the second input buffer circuit 20 into the first sampling circuit 33 based on the data DQ_FALL transmitted by the second sampling circuit 34.

Alternatively, when the data DQ_RISE transmitted by the first sampling circuit 33 to the control terminal c of the second selecting circuit 32 is 1, the second selecting circuit 32 selects to input the output data of the first input buffer circuit 10 into the second sampling circuit 34. When the data DQ_RISE transmitted by the first sampling circuit 33 to the control terminal c of the second selecting circuit 32 is 0, the second selecting circuit 32 selects to input the output data of the second input buffer circuit 20 into the second sampling circuit 34.

When the data DQ_FALL transmitted by the second sampling circuit 34 to the control terminal c of the first selecting circuit 31 is 1, the first selecting circuit 31 selects to input the output data of the first input buffer circuit 10 into the first sampling circuit 33. When the data DQ_FALL transmitted by the second sampling circuit 34 to the control terminal c of the first selecting circuit 31 is 0, the first selecting circuit 31 selects to input the output data of the second input buffer circuit 20 into the first sampling circuit 33.

Alternatively, the first selecting circuit 31 and the second selecting circuit 32 may have the same circuit structure, to improve a circuit matching degree and reduce circuit design cost.

Alternatively, the first sampling circuit 33 and the second sampling circuit 34 may have the same circuit structure to improve a circuit matching degree and reduce circuit design cost.

Further, the equalizer circuit further includes a sampling clock input circuit 50. An output terminal of the sampling clock input circuit 50 is respectively connected with sampling clock input terminals of the first sampling circuit 33 and the second sampling circuit 34, and can provide sampling clock signals to the first sampling circuit 33 and the second sampling circuit 34.

The sampling clock input circuit 50 can receive sampling clock signals DQS and DQSB which are inverted to each other.

In addition, the sampling clock input circuit 50 further includes a comparator circuit and a delay circuit. The delay circuit may be configured to regulate a phase of the sampling clock signal outputted by the comparator circuit.

Exemplarily, when the sampling clock signal DQS received by the first sampling circuit 33 is at a rising edge, the first sampling circuit 33 performs data sampling based on the data signal outputted by the first selecting circuit 31 to sample the data DQ_RISE, and transmits the data DQ_RISE to the second selecting circuit 32 as a control signal of the second selecting circuit 32. When the sampling clock signal DQS received by the second sampling circuit 34 is at a falling edge, the second sampling circuit 34 performs data sampling based on the data signal outputted by the second selecting circuit 32 to sample the data DQ_FALL and transmits the data DQ_FALL to the first selecting circuit 31 as a control signal of the first selecting circuit 31.

Further, still referring to FIG. 2, the first input buffer circuit 10 includes a first comparator circuit 11 and a first delay circuit 12, the first comparator circuit 11 is connected in series with the first delay circuit 12, and a reference voltage input terminal of the first comparator circuit 11 is connected with the first reference voltage output terminal H.

The second input buffer circuit 20 includes a second comparator circuit 21 and a second delay circuit 22, the second comparator circuit 21 is connected in series with the second delay circuit 22, and a reference voltage input terminal of the second comparator circuit 21 is connected with the second reference voltage output terminal L.

A signal input terminal of the first comparator circuit 11 and a signal input terminal of the second comparator circuit 21 are connected with the same input data signal DQ.

The first delay circuit 12 may be configured to regulate a phase of the signal DQ, such that the signal DQ received by the first sampling circuit 33 can be synchronized with the sampling clock signal, so the first sampling circuit 33 can sample correct data according to the sampling clock signal. The second delay circuit 22 is also configured to regulate a phase of the signal DQ, such that the DQ signal received by the second sampling circuit 34 is synchronized with the sampling clock signal, so the second sampling circuit 34 can sample correct data according to the sampling clock signal.

Alternatively, the first comparator circuit 11 and the second comparator circuit 21 may have the same circuit structure, to improve a circuit matching degree and reduce circuit design cost.

Alternatively, the first delay circuit 12 and the second delay circuit 22 may have the same circuit structure to improve a circuit matching degree and reduce circuit design cost.

It can be understood that, if the data outputted currently by the equalizer circuit is data sampled by the first sampling circuit 33 when the sampling clock signal DQS is at the rising edge, data outputted previously by the equalizer circuit is data sampled by the second sampling circuit 34 when the sampling clock signal DQS is at a previous falling edge adjacent to the rising edge. If the data outputted currently by the equalizer circuit is data sampled by the second sampling circuit 34 when the sampling clock signal DQS is at a falling edge, data outputted previously by the equalizer circuit is data sampled by the first sampling circuit 33 when the sampling clock signal DQS is at a previous rising edge adjacent to the falling edge.

Figure 3:
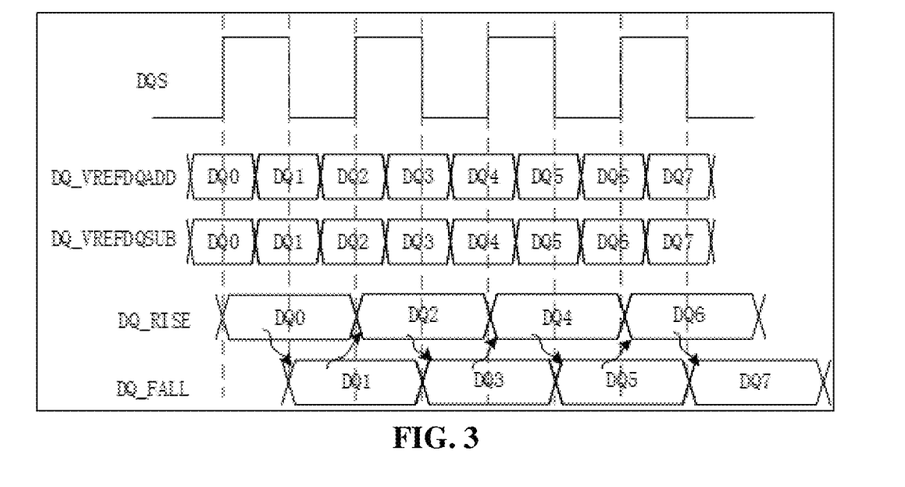
FIG. 3 illustrates a waveform graph in a data acquisition process of an equalizer circuit provided in the embodiment of the present disclosure.

In order to better understand the embodiment of the present disclosure, referring to FIG. 3, FIG. 3 illustrates a waveform graph in a data acquisition process of the equalizer circuit provided in the embodiment of the present disclosure.

In FIG. 3, DQ_VREFDQADD represents data outputted by the first input buffer circuit 10 based on the DQ signal and the first reference voltage H, which includes DQ0, DQ1, DQ2 . . . DQ_VREFDQSUB represents data outputted by the second input buffer circuit 20 based on the DQ signal and the second reference voltage L, which also includes DQ0, DQ1, DQ2. . . .

In the embodiment of the present disclosure, when the sampling clock signal DQS received by the first sampling circuit 33 is at the rising edge, the data DQ0 is sampled and transmitted to the second selecting circuit 32. If the value of the data DQ0 is 1, the second selecting circuit 32 outputs data generated in the first input buffer circuit 10 to the second sampling circuit 34 through its input terminal a. When the sampling clock signal DQS received by the second sampling circuit 34 is at a falling edge, the data DQ1 outputted by the first input buffer circuit 10 can be sampled. If the value of data DQ0 is 0, the second selecting circuit 32 outputs data generated by the second input buffer circuit 20 to the second sampling circuit 34 through the input terminal b, and when the sampling clock signal DQS received by the second sampling circuit 34 is at a falling edge, the data DQ1 outputted by the second input buffer circuit 20 can be sampled.

Similarly, after sampling the data DQ1, the second sampling circuit 34 transmits DQ1 to the first selecting circuit 31. If the value of the data DQ1 is 1, the first selecting circuit 31 outputs the data generated in the first input buffer circuit 10 to the first sampling circuit 33 through the input terminal a, and when the sampling clock signal DQS received by the first sampling circuit 33 is at a rising edge, the data DQ2 outputted by the first input buffer circuit 10 can be sampled. If the value of the data DQ1 is 0, the first selecting circuit 31 outputs the data generated in the second input buffer circuit 20 to the first sampling circuit 33 through the input terminal b, and when the sampling clock signal DQS received by the first sampling circuit 33 is at a rising edge, the data DQ2 outputted by the second input buffer circuit 20 can be sampled.

Based on the content described in the above embodiment, in a feasible implementation of the present disclosure, the first reference voltage enhances the reference voltage, and the second reference voltage weakens the reference voltage. Therefore, when the data outputted previously by the equalizer circuit is 1, the data signal outputted by the first input buffer circuit having a reference voltage which is equal to the first reference voltage is selected and data sampling is performed on the selected data signal. When the data outputted previously by the equalizer circuit is 0, the data signal outputted by the second input buffer circuit having a reference voltage which is equal to the second reference voltage is selected, and data sampling is performed on the selected data signal. The input voltage margin of the equalizer circuit can be effectively improved, thereby effectively eliminating ISI and improving the opening size of an eye diagram of the written data.

Figure 4:
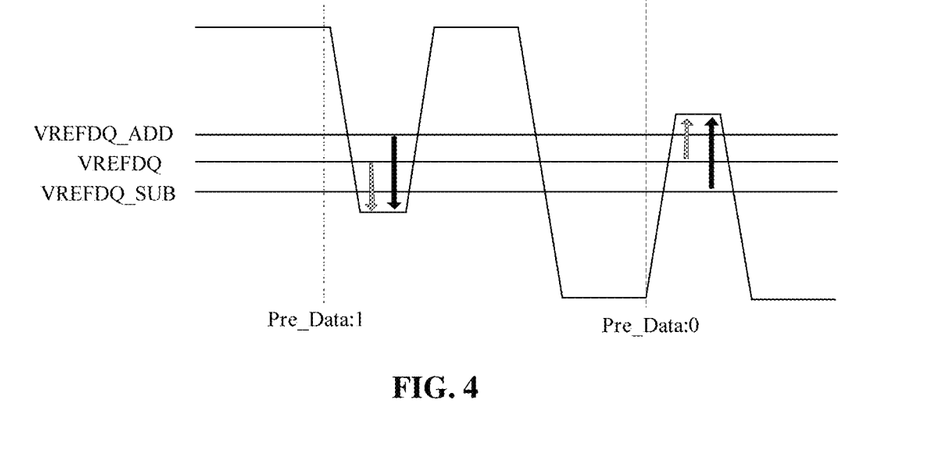
FIG. 4 illustrates a schematic diagram of an equalization effect of an equalizer circuit provided in the embodiment of the present disclosure.

In order to better understand the embodiment of the present disclosure, referring to FIG. 4, FIG. 4 illustrates a schematic diagram of an equalization effect of the equalizer circuit provided in the embodiment of the present disclosure.

In FIG. 4, it can be seen clearly that when a value of data Pre_Data outputted previously by the equalizer circuit is 1, the data signal outputted by the first input buffer circuit having the reference voltage which is the first reference voltage VREFDQ_ADD is selected and data sampling is performed on the selected data signal. The input voltage margin (shown as the black arrow) of the equalizer circuit is significantly greater than the input voltage margin (shown as the gray arrow) of the equalizer circuit when data sampling is performed on the data signal outputted by the input buffer circuit having the reference voltage which is the reference voltage VREFDQ.

Similarly, when the value of data Pre_Data outputted previously by the equalizer circuit is 0, the data signal outputted by the second input buffer circuit having the reference voltage which is the second reference voltage VREFDQ_SUB is selected and data sampling is performed on the selected data signal. The input voltage margin (shown as the black arrow) of the equalizer circuit is significantly greater than the input voltage margin (shown as the gray arrow) of the equalizer circuit when data sampling is performed on the data signal outputted by the input buffer circuit having the reference voltage which is the reference voltage VREFDQ.

The equalizer circuit provided by the embodiment of the present disclosure includes two input buffer circuits having different reference voltages. When data is sampled, an appropriate input buffer circuit is selected from the two input buffer circuits based on the data outputted previously by the equalizer circuit, and then data sampling is performed on the data signal outputted by the selected input buffer circuit, thereby effectively increasing an input voltage margin of the equalizer circuit and improving the receiving quality of the data signal.

Further, based on the equalizer circuit described in the embodiment, the embodiment of the present disclosure further provides a method for sampling data, which is applied to the equalizer circuit described in the embodiment. The method includes the following operations.

In response to a sampling block signal, a data signal outputted by one of the two input buffer circuits is selected according to data outputted previously by the equalizer circuit, and data sampling is performed on the selected data signal, and sampled data is taken as data outputted currently by the equalizer circuit.

Alternatively, the above method may be executed by the selecting and sampling circuit in the equalizer circuit. For example, after the equalizer circuit outputs data, the outputted data is sent to the selecting and sampling circuit. When the sampling clock signal received by the selecting and sampling circuit is at a rising edge or a falling edge, the selecting and sampling circuit selects to perform data sampling on the data signal outputted by one of the two input buffer circuits according to the data outputted previously by the equalizer circuit, and takes the sampled data as the data outputted currently by the equalizer circuit.

That is, in the method for sampling data provided by the embodiment of the present disclosure, when data is sampled, data acquisition is performed on a data signal outputted by one input buffer circuit selected from the two input buffer circuits of the equalizer circuit according to the data outputted previously by the equalizer circuit, so as to perform data equalization in advance, thereby more effectively eliminating ISI and improving the receiving quality of the data signal.

It should be noted that, for the processing mode used by the method for sampling data, reference may be made to the operations principle of the equalizer circuit described in the above embodiment, which will not be repetitively described here.

Further, based on the equalizer circuit described in the above embodiment, the embodiment of the present disclosure further provides a memory, which includes the equalizer circuit described in the embodiment. For details of the memory, reference may be made to the operation principle of the equalizer circuit described in the above embodiment, which will not be repetitively described here.

Finally, it should be noted that the embodiments are only used for describing the technical solutions of the present disclosure, instead of limiting the present disclosure. Although the present disclosure has been described in detail with reference to the embodiments, those skilled in the art should understand that modifications to the technical solutions recorded in the embodiments can be made, or equivalent replacements to some or all of the technical features can be made, and these modifications or equivalent replacements do not make the essence of the corresponding technical solution go beyond the scope of the technical solutions of the embodiments of the present disclosure.

The invention claimed is:

1. An equalizer circuit, comprising:
a first input buffer circuit, a second input buffer circuit and a selecting and sampling circuit,
wherein the first input buffer circuit and the second input buffer circuit are respectively connected with the selecting and sampling circuit, and a reference voltage used in the first input buffer circuit is different from that used in the second input buffer circuit, and
the selecting and sampling circuit selects to perform data sampling on a data signal outputted by the first input buffer circuit or a data signal outputted by the second input buffer circuit according to data outputted previously by the equalizer circuit, and takes sampled data as data outputted currently by the equalizer circuit, wherein the selecting and sampling circuit comprises a selecting circuit and a sampling circuit, and the selecting circuit is connected with the sampling circuit, wherein the selecting circuit is configured to select to input the data signal outputted by the first input buffer circuit or the data signal outputted by the second input buffer circuit into the sampling circuit according to data transmitted by the sampling circuit, and the sampling circuit is configured to perform data sampling on the data signal inputted by the selecting circuit, wherein the selecting circuit comprises a first selecting circuit and a second selecting circuit, and the sampling circuit comprises a first sampling circuit and a second sampling circuit, and wherein two input terminals of the first selecting circuit are respectively connected with an output terminal of the first input buffer circuit and an output terminal of the second input buffer circuit, two input terminals of the second selecting circuit are respectively connected with the output terminal of the first input buffer circuit and the output terminal of the second input buffer circuit, an output terminal of the first selecting circuit is connected with an input terminal of the first sampling circuit, a control terminal of the first selecting circuit is connected with an output terminal of the second sampling circuit, an output terminal of the second selecting circuit is connected with an input terminal of the second sampling circuit, and a control terminal of the second selecting circuit is connected with an output terminal of the first sampling circuit.

2. The equalizer circuit of claim 1, further comprising a dual reference voltage generator, wherein the dual reference voltage generator comprises a first reference voltage output terminal and a second reference voltage output terminal, the first reference voltage output terminal is connected with a reference voltage input terminal of the first input buffer circuit, and the second reference voltage output terminal is connected with a reference voltage input terminal of the second input buffer circuit.

3. The equalizer circuit of claim 1, wherein the first sampling circuit transmits currently-sampled data to the control terminal of the second selecting circuit, and the second selecting circuit selects to input data in the first input buffer circuit or the second input buffer circuit into the second sampling circuit based on the data transmitted by the first sampling circuit, and the second sampling circuit transmits currently-sampled data to the control terminal of the first selecting circuit, and the first selecting circuit selects to input the data in the first input buffer circuit or the second input buffer circuit into the first sampling circuit based on the data transmitted by the second sampling circuit.

4. The equalizer circuit of claim 3, wherein when the data transmitted by the first sampling circuit to the control terminal of the second selecting circuit is 1, the second selecting circuit selects to input output data of the first input buffer circuit into the second sampling circuit, and when the data transmitted by the first sampling circuit to the control terminal of the second selecting circuit is 0, the second selecting circuit selects to input output data of the second input buffer circuit into the second sampling circuit, and when the data transmitted by the second sampling circuit to the control terminal of the first selecting circuit is 1, the first selecting circuit selects to input the output data of the first input buffer circuit into the first sampling circuit, and when the data transmitted by the second sampling circuit to the control terminal of the first selecting circuit is 0, the first selecting circuit selects to input the output data of the second input buffer circuit into the first sampling circuit.

5. The equalizer circuit of claim 4, wherein the equalizer circuit further comprises a sampling clock input circuit, and an output terminal of the sampling clock input circuit is respectively connected with sampling clock input terminals of the first sampling circuit and the second sampling circuit; and the sampling clock input circuit is configured to provide a sampling clock signal to the first sampling circuit and the second sampling circuit.

6. The equalizer circuit of claim 5, wherein the first sampling circuit performs data sampling on data inputted by the first selecting circuit by using a rising edge of the sampling clock signal received by the equalizer circuit; and the second sampling circuit performs data sampling on data inputted by the second selecting circuit by using a falling edge of the sampling clock signal received by the equalizer circuit.

7. The equalizer circuit of claim 6, wherein in response to the data outputted currently by the equalizer circuit being the data sampled by the first sampling circuit using the rising edge of the sampling clock signal received by the equalizer circuit, data outputted previously by the equalizer circuit is data sampled by the second sampling circuit when the sampling clock signal received by the equalizer circuit is at a previous falling edge adjacent to the rising edge; and in response to the data outputted currently by the equalizer circuit being the data sampled by the second sampling circuit using the falling edge of the sampling clock signal received by the equalizer circuit, data outputted previously by the equalizer circuit is data sampled by the first sampling circuit when the sampling clock signal received by the equalizer circuit is at a previous rising edge adjacent to the falling edge.

8. The equalizer circuit of claim 2, wherein the first input buffer circuit comprises a first comparator circuit and a first delay circuit, the first comparator circuit is connected in series with the first delay circuit, and a reference voltage input terminal of the first comparator circuit is connected with the first reference voltage output terminal, the second input buffer circuit comprises a second comparator circuit and a second delay circuit, the second comparator circuit is connected in series with the second delay circuit, and a reference voltage input terminal of the second comparator circuit is connected with the second reference voltage output terminal; and a signal input terminal of the first comparator circuit and a signal input terminal of the second comparator circuit are connected with a same input data signal.

9. The equalizer circuit of claim 8, wherein the first comparator circuit and the second comparator circuit have a same circuit structure.

10. The equalizer circuit of claim 8, wherein the first delay circuit and the second delay circuit have a same circuit structure.

11. The equalizer circuit of claim 1, wherein the first selecting circuit and the second selecting circuit have a same circuit structure.

12. The equalizer circuit of claim 1, wherein the first sampling circuit and the second sampling circuit have a same circuit structure.

13. The equalizer circuit of claim 1, wherein the reference voltage used in the first input buffer circuit is greater than a reference voltage used in the second input buffer circuit.

14. A method for sampling data applied to an equalizer circuit, wherein the equalizer circuit comprises two input buffer circuits, and reference voltages used in the two input buffer circuits are different from each other;

wherein the method comprises:
in response to a sampling clock signal selecting to perform data sampling on a data signal outputted by one input buffer circuit of the two input buffer circuits according to data outputted previously by the equalizer circuit, and taking sampled data as data outputted currently by the equalizer circuit,
wherein the equalizer circuit further comprises a selecting and sampling circuit which is connected with the two input buffer circuits and comprises a selecting circuit and a sampling circuit, the two input buffer circuits comprise a first input buffer circuit and a second input buffer circuit, and the selecting circuit is connected with the sampling circuit,
wherein the selecting to perform data sampling on a data signal outputted by one input buffer circuit of the two input buffer circuits according to data outputted previously by the equalizer circuit comprises:
selecting, by the selecting circuit, to input a data signal outputted by the first input buffer circuit or a data signal outputted by the second input buffer circuit into the sampling circuit according to data transmitted by the sampling circuit, and performing, by the sampling circuit, data sampling on the data signal inputted by the selecting circuit,
wherein the selecting circuit comprises a first selecting circuit and a second selecting circuit, and the sampling circuit comprises a first sampling circuit and a second sampling circuit, and
wherein two input terminals of the first selecting circuit are respectively connected with an output terminal of the first input buffer circuit and an output terminal of the second input buffer circuit, two input terminals of the second selecting circuit are respectively connected with the output terminal of the first input buffer circuit and the output terminal of the second input buffer circuit, an output terminal of the first selecting circuit is connected with an input terminal of the first sampling circuit, a control terminal of the first selecting circuit is connected with an output terminal of the second sampling circuit, an output terminal of the second selecting circuit is connected with an input terminal of the second sampling circuit, and a control terminal of the second selecting circuit is connected with an output terminal of the first sampling circuit.

15. A memory, comprising:
an equalizer circuit, wherein the equalizer circuit comprises a first input buffer circuit, a second input buffer circuit and a selecting and sampling circuit,
wherein the first input buffer circuit and the second input buffer circuit are respectively connected with the selecting and sampling circuit, and a reference voltage used in the first input buffer circuit is different from that used in the second input buffer circuit, and
the selecting and sampling circuit selects to perform data sampling on a data signal outputted by the first input buffer circuit or a data signal outputted by the second input buffer circuit according to data outputted previously by the equalizer circuit, and takes sampled data as data outputted currently by the equalizer circuit,
wherein the selecting and sampling circuit comprises a selecting circuit and a sampling circuit, and the selecting circuit is connected with the sampling circuit,
wherein the selecting circuit is configured to select to input the data signal outputted by the first input buffer circuit or the data signal outputted by the second input buffer circuit into the sampling circuit according to data transmitted by the sampling circuit, and the sampling circuit is configured to perform data sampling on the data signal inputted by the selecting circuit,
wherein the selecting circuit comprises a first selecting circuit and a second selecting circuit, and the sampling circuit comprises a first sampling circuit and a second sampling circuit, and
wherein two input terminals of the first selecting circuit are respectively connected with an output terminal of the first input buffer circuit and an output terminal of the second input buffer circuit, two input terminals of the second selecting circuit are respectively connected with the output terminal of the first input buffer circuit and the output terminal of the second input buffer circuit, an output terminal of the first selecting circuit is connected with an input terminal of the first sampling circuit, a control terminal of the first selecting circuit is connected with an output terminal of the second sampling circuit, an output terminal of the second selecting circuit is connected with an input terminal of the second sampling circuit, and a control terminal of the second selecting circuit is connected with an output terminal of the first sampling circuit.

* * * * *